United States Patent
Hellberg et al.

(10) Patent No.: US 8,917,141 B2
(45) Date of Patent: Dec. 23, 2014

(54) RADIO FREQUENCY POWER AMPLIFIER CIRCUIT AND METHOD

(75) Inventors: Richard Hellberg, Huddinge (SE); Tony Fonden, Kista (SE); Mats Klingberg, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/505,777

(22) PCT Filed: Apr. 10, 2012

(86) PCT No.: PCT/EP2012/056429
§ 371 (c)(1),
(2), (4) Date: May 3, 2012

(87) PCT Pub. No.: WO2013/091905
PCT Pub. Date: Jun. 27, 2013

(65) Prior Publication Data
US 2014/0320213 A1     Oct. 30, 2014

Related U.S. Application Data

(60) Provisional application No. 61/577,741, filed on Dec. 20, 2011.

(51) Int. Cl.
*H03F 3/68*      (2006.01)
(52) U.S. Cl.
USPC .................... 330/124 R; 330/295; 330/149
(58) Field of Classification Search
USPC ..................... 330/124 R, 295, 149
IPC .......................................................... H03F 3/68
See application file for complete search history.

(56) References Cited

U.S. PATENT DOCUMENTS 7,071,774 B2 *   7/2006   Hellberg ................... 330/124 R
7,260,157 B2 *   8/2007   Hagh et al. ..................... 375/297

(Continued)

FOREIGN PATENT DOCUMENTS

EP     1758242 A1    2/2007
WO    0195480 A1    12/2001

(Continued)

OTHER PUBLICATIONS

Kim, "Doherty feed-forward amplifier performance using a novel crest factor reduction technique," IEEE Microwave and Wireless Components, vol. 17, No. 1, Jan. 2007, pp. 82-84.

(Continued)

*Primary Examiner* — Patricia Nguyen
(74) *Attorney, Agent, or Firm* — Withrow & Terranova, PLLC

(57) ABSTRACT

An amplifier circuit is disclosed for providing a radio frequency output signal having a variable signal envelope, comprising a main amplifier device and an auxiliary amplifier and a combiner network for combining an output signal from said first amplifier device and a second output signal from said second amplifier device to provide a combined output signal of variable signal envelope to a load, and a signal processing circuit comprising an input and a non-linear processing section to provide at least said second radio frequency output signal with a signal envelope that has a non-linear dependency from an amplitude characteristic of the input signal such that the degree of non-linearity of the non-linear dependency varies dependent on the amount of change per time unit of the amplitude characteristic of the input signal. Further, a method of power amplifying a radio frequency signal having a variable signal envelope is disclosed.

17 Claims, 7 Drawing Sheets

(56) References Cited

U.S. PATENT DOCUMENTS

| | | | |
|---|---|---|---|
| 7,288,987 B2 * | 10/2007 | Carichner et al. | 330/136 |
| 2003/0137346 A1 | 7/2003 | Hellberg | |
| 2008/0238544 A1 | 10/2008 | Morris et al. | |
| 2009/0096522 A1 * | 4/2009 | Tsuchiya et al. | 330/149 |
| 2010/0225389 A1 | 9/2010 | Teetzel | |

FOREIGN PATENT DOCUMENTS

| | | |
|---|---|---|
| WO | 0205420 A1 | 1/2002 |
| WO | 0205421 A1 | 1/2002 |
| WO | 02095933 A1 | 11/2002 |
| WO | 2006027583 A1 | 3/2006 |
| WO | 2006068553 A1 | 6/2006 |
| WO | 2006068555 A1 | 6/2006 |
| WO | 2006091134 A1 | 8/2006 |
| WO | 2008004923 A1 | 1/2008 |

OTHER PUBLICATIONS

Chireix, "High power outphasing modulation," Proceedings of the Institute of Radio Engineers, vol. 25, No. 11, Nov. 1935, pp. 1370-1392.

Doherty, "A new high efficiency power amplifier for modulated waves," Proceedings of the Institute of Radio Engineers, vol. 24, No. 9, Sep. 1936, pp. 1163-1182.

International Search Report and Written Opinion for PCT/EP2012/056429 mailed Oct. 5, 2012, 9 pages.

International Preliminary Report on Patentability for PCT/EP2012/056429, mailed Jun. 24, 2014, 6 pages.

* cited by examiner

RADIO FREQUENCY POWER AMPLIFIER CIRCUIT AND METHOD

This application is a 35 U.S.C. §371 national phase filing of International Application No. PCT/EP2012/056429, filed Apr. 10, 2012, which claims the benefit of U.S. Provisional Patent Application No. 61/577,741, filed Dec. 20, 2011, the disclosures of which are incorporated herein by reference in their entireties.

The present invention relates to an amplifier circuit for providing a radio frequency output signal having a variable signal envelope. The present invention furthermore relates to a method of providing a power amplified radio frequency signal having a variable signal envelope.

In the field of mobile communication technology, the power efficiency of radio frequency signal amplifiers deployed in mobile communication terminals is an important requirement. The power efficiency of the RF amplifier will have a strong impact on the amount of electrical power drawn by the mobile station from the battery when transmitting RF signals and thus influences how long the mobile terminal can be operated without connection to a battery charger.

RF amplifiers output stages operating in class B or class C are known to be quite power efficient. Output stages operating in class B or C essentially use a half wave or less than a half wave of the RF input signal to drive an amplifier device having a load impedance. For RF signals having an essentially constant signal envelope, the operating point of this kind of output stage can be set such that sufficiently low power dissipation in the amplifier device and thus, high power efficiency is achieved. In some designs, maximum power efficiency is achieved when the amplifier device is driven at such a level that the RE voltage level across the amplifier device is as large as possible. At lower driving levels however, the power efficiency will then be less than the optimal value.

RF signals having a variable signal envelope therefore impose additional challenges on the design of power efficient RF amplifiers. If the signal envelope of the RF signal is not constant but variable, this results in that the output stage is driven at variable power levels in accordance with the instantaneous signal envelope and thus at the average below levels at which the amplifier can operate with high efficiency. This results in a reduced average power efficiency of the amplifier.

The average power efficiency of the RF amplifier for RF signals with varying signal envelope can be improved if instead of a single amplifier device, a main amplifier device and one or more auxiliary amplifiers are used to provide the RF output signal through a combiner network. A main amplifier device is designed for example such that it reaches its operating point of optimum power efficiency already at a point below the upper limit of the dynamic range of the input signal. If the input signal level reaches beyond this point, an auxiliary amplifier device contributes to the output signal through the combiner network. The Doherty type radio frequency power amplifiers use a main amplifier and an auxiliary amplifier in this manner such that they are efficient for RF signals having a signal envelope that is variable over time.

The combiner network in an RF power amplifier having a main amplifier device and at least an auxiliary amplifier device will inherently exhibit some kind of band limited frequency response. For example, a Doherty type amplifier uses a quarter wavelength transmission line or an equivalent reactive network for combining the RF power contributions of the main amplifier device and the auxiliary amplifier device.

Moreover, at least the level at which the auxiliary amplifier is driven, shows a strongly non-linear functional dependency from the signal envelope of the RF signal. The auxiliary amplifier has to be driven by a signal that is obtained by applying this non-linear function on the time varying signal envelope of the RF signal. This causes a widening of the bandwidth of the signal driving the auxiliary amplifier. As long as the signal envelope varies slowly, this bandwidth widening would not be critical for the operation of the combiner network or of the auxiliary amplifier device. However, if the signal envelope of the RF signal becomes more wideband, the band widening effect of the non-linearity of the functional dependency of the driving level of the auxiliary amplifier from the signal envelope can result in that the bandwidth of at least some of the components of the RF power amplifier may no longer be sufficient to keep the power efficiency of the amplifier at an acceptable level.

A power amplifier according to an embodiment of the present invention for providing a radio frequency output signal having a variable signal envelope comprises an amplifier circuit for providing a radio frequency output signal having a variable signal envelope, comprising a main amplifier device having an input and an output for outputting a first radio frequency output signal; an auxiliary amplifier device having an input and an output for outputting a second radio frequency output signal; a combiner network for combining at least a component of said first radio frequency output signal from said first amplifier device and at least a component of said second radio frequency output signal from said second amplifier device to provide a combined output signal of variable signal envelope to a load; a signal processing circuit having an input for receiving an input signal, and a first output coupled to the input of the main amplifier device for providing a first radio frequency signal to be amplified by said first amplifier device, and a second output coupled to the input of the second amplifier device for providing a second radio frequency signal to be amplified by said second amplifier device; wherein said signal processing circuit comprises a non-linear processing section coupled to the input of the signal processing circuit and adapted to provide at least said second radio frequency signal with a signal envelope that has a non-linear dependency from an amplitude characteristic of the input signal; wherein the non-linear processing section is adapted such that the degree of non-linearity of the non-linear dependency varies dependent on the amount of change per time unit of the amplitude characteristic of the input signal.

According to a non-limiting example embodiment of the present invention, the degree of non-linearity of the non-linear dependency is higher if the amplitude characteristic varies at a first, slow rate than if the amplitude characteristic varies at a faster rate. In this manner the power amplifier circuit according to this embodiment of the present invention dynamically restricts the bandwidth expansion of the signal driving the auxiliary amplifier device.

If the non-linear dependency is denoted as f(x) and f is approximated in terms of a polynomial expression as a sum from i (integer)=0 to N>0 of $a_i * x^i$, the degree of non-linearity would be N. The present invention is, however, not limited to any polynomial representation of the non-linearity f. Rather, the term 'degree of non-linearity' is intended to comprise any measure that allows distinguishing between strongly non-linear dependencies and less strongly non-linear dependencies. According to a non-limiting example, at a rate of variation of zero or close to zero, the non-linearity exhibits two or more sections of different yet positive slopes joined by a sharp bend. With an increasing rate of variation, the bend changes into a progressively softer curve. The non-linear dependency can be provided in any suitable manner including digital signal processing, overshoot extraction circuits, adders/subtractors and filters for frequency selective filtering of the extracted overshoot of the input signal. The non-linear dependency can be implemented using analogue or digital circuits or a combination of both. For example, the amplitude characteristic subject to non-linear processing of the input signal can be processed in a digital signal processing means to obtain a control signal that controls the signal envelope of a radio frequency signal driving the auxiliary amplifier device. According to another non-limiting example embodiment, the signal processing circuit provides a suitable signal directly at the radio frequency or at a suitable intermediate frequency.

Some embodiments of the present invention achieve high efficiency and low bandwidth expansion by the dynamic non-linear dependency of the signal envelope of at least the signal driving the auxiliary amplifier device from the input signal. The power efficiency of the power amplifier circuit can remain high particularly when the signal envelope of the RF output signal varies slowly, that is at a low rate, such that an advantageous average power efficiency of the amplifier circuit can be achieved. Advantageously but not necessarily, also the signal driving the main amplifier device has a signal envelope that shows a non-linear dynamic dependency from an amplitude characteristic of the input signal, which will, however, be different from and preferably complementary to the non-linear dependency used for driving the first amplifier device.

The term 'envelope' of a signal denotes the difference between any local maximum and the adjacent local minimum of the signal. For example, if the local maxima (the local positive peaks) of the RF signal are joined by an upper line and all local minima (the local negative peaks) of the RF signal are joined by a lower line, the vertical extension between the upper and the lower line yields the signal envelope. An RF signal carrying an amplitude modulation has a signal envelope that is variable over time. The signal envelope may or may not correspond to the amplitude modulated signal, depending on the kind of amplitude modulation that is used. Also, while amplitude modulated signals are useful examples of signals having a variable signal envelope, an RF signal having a variable signal envelope does not always have to carry an amplitude modulation. A very simple yet non-limiting example of obtaining a measure of the envelope of a signal is rectifying the signal and smoothing the result by a capacitor.

According to a non-limiting example embodiment of the present invention, the RE power amplifier circuit can be designed such that the input signal to the power amplifier circuit can be an amplitude modulated signal at radio frequency or at a suitable intermediate frequency, such that the above mentioned amplitude characteristic of the input signal is the envelope of the input signal. According to other embodiments of the present invention, the input signal can be a base band signal such that the amplitude characteristic of the input signal would then be the instantaneous input signal amplitude. According to yet another embodiment, the input signal is time and amplitude discrete and represents in digital form an amplitude characteristic to control the envelope of the output signal of the RF power amplifier.

The present invention also relates to a mobile communication device comprising an RF power amplifier as claimed. Such mobile communication devices include mobile radio telephones, smart phones, portable computers like tablet PCs and the like. The present invention furthermore relates to a base station for a mobile communication network, the base station comprising an RF power amplifier as claimed. The term base station includes Base Transceiver Stations BTS, Node B, eNode B, Radio Network Controllers and the like.

The present invention also relates to a method of providing a power amplified radio frequency signal having a variable signal envelope, comprising providing a first radio frequency output signal by a main amplifier device; providing a second radio frequency output signal by an auxiliary amplifier device; combining at least a component of said first radio frequency output signal from said first amplifier device and at least a component of said second radio frequency output signal from said second amplifier device in a combiner network to provide a combined output signal of variable signal envelope to a load; signal processing an input signal in a signal processing circuit to provide a first output signal to the input of the main amplifier device for providing a first radio frequency signal to be amplified by said first amplifier device; and a second output signal to the input of the second amplifier device for providing a second radio frequency signal to be amplified by said second amplifier device; said signal processing comprising non-linear processing of said input signal to provide a non-linear dependency of the envelope of at least said second radio frequency signal from an amplitude characteristic of the input signal; wherein the degree of non-linearity of the non-linear dependency varies dependent on the amount of change per time unit of the amplitude characteristic of the input signal.

In the following, advantageous example embodiments of the present invention will be described with reference to the accompanying figures. It has to be noted that everything in the figures and the accompanying description is meant to be purely illustrative and shall not be construed to limit the scope of the present invention.

In the figures.

Figure 1:
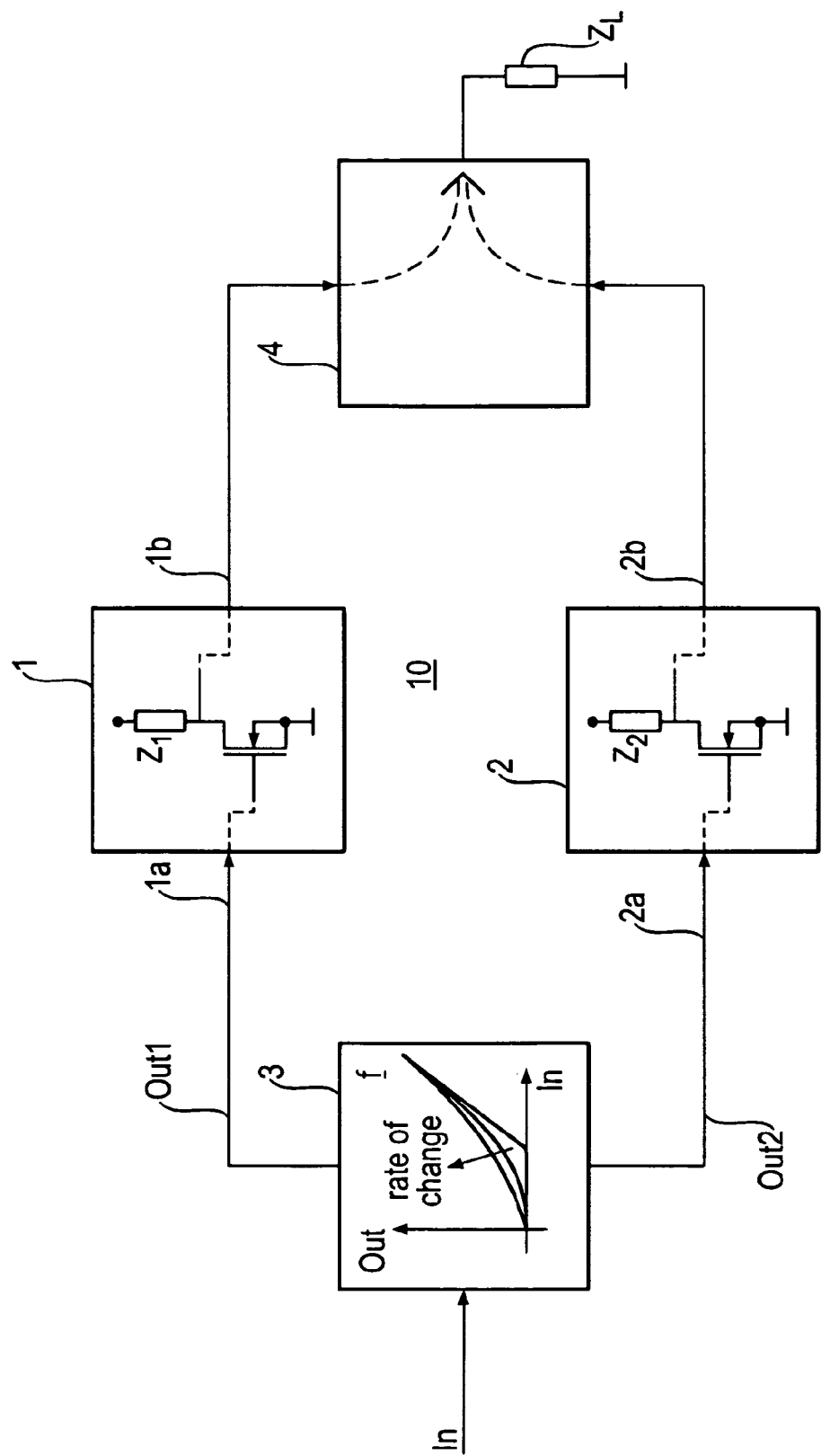
FIG. 1 shows a block diagram of an exemplary embodiment of a radio frequency power amplifier according to the present invention.

FIG. 1 shows a block diagram of an exemplary embodiment of a radio frequency power amplifier according to the present invention. In this figure, 1 and 2 denote a main amplifier device and an auxiliary amplifier device, respectively. 1a and 2a denote inputs of the respective amplifier devices. 1b and 2b denote outputs of the respective amplifier devices. 3 denotes a signal processing circuit having an input for receiving a signal In as well as outputs Out1 and Out2 respectively coupled to the inputs 1a and 2a of the main and auxiliary amplifier devices 1 and, resp. In the exemplary embodiment shown in FIG. 1, the amplifier devices 1 and 2 each include a solid state device and a load impedance, Z1 and Z2, in the drain circuit, resp., such that the respective amplifier device can operate for example in class B or class C by virtue of a suitable bias network which is well known as such and, therefore, not shown. 4 denotes a combiner network for combining RF output signals from the main and auxiliary amplifier devices at the output of the RF power amplifier 10 into a load ZL, for example an antenna network.

For efficient operation of an RF power amplifier, the output network that connects the transistor output terminals to a common load needs to be designed according to certain rules. In case of a Doherty amplifier it can be advantageous to use a λ/4 transmission line as the combiner network 4 or any other suitable reactive network. Furthermore, the output signals (RF currents and voltages) need to be shaped to include both linear and nonlinear components, the nonlinear components being nonlinear functions of the desired RF output signal envelope. This invention deals with this shaping of these nonlinear parts, or a combination of nonlinear and linear parts, of the output signals.

The nonlinear parts of the output signals can be seen as extra voltages (compared to a regular amplifier) that push up the transistor output voltages so they stay close to the maximum allowed voltage for the upper part of the amplitude range. They can alternatively be seen as the extra currents that push down (reduce) the RF currents so that their sum stays close to a parabolic curve (vs. composite amplifier output voltage). (An entirely parabolic sum current gives constant efficiency under constant supply voltage.) The nonlinear parts of the output currents or the output voltages are, because they are nonlinear functions of the (envelope of the) RF signal, more wideband than the output signal.

The wideband nonlinear components in the outputs of the transistors (or at least one of them) have to have high precision in order to achieve the linearity and efficiency required in many applications. This means that they often in practice have to be created in the digital domain. When they are created digitally, they must each fit inside the bandwidth of a Digital-to-Analog Converter (DAC) which can be comprised, for example, in the signal processing circuit (3) shown in FIG. 1, or at any other suitable location. A wideband DAC is more expensive than a narrowband one. For wideband systems the large bandwidth expansion factor combined with the large output signal bandwidth may mean that the appropriate DAC is prohibitively expensive, or even impossible to manufacture.

After being converted into analog form, the wideband non-linear signals must be translated to the right frequency, filtered and amplified. These processing stages become more difficult the more wideband the signals are.

A high-order function follows more closely the ideal non-linear (sharp-kneed) curve than does a low-order non-linear function. The difference between the ideal and actual transistor voltage amplitudes is therefore less than for the low-order function, resulting in higher efficiency. However, the band-width of the high-order function is larger than that of the low-order function State-of-the art static nonlinear functions for use for example in Doherty amplifiers are thus either wideband (high order) and give high efficiency, or are more narrowband (for example low order polynomials) but give low efficiency.

Requirements for high efficiency and low bandwidth expansion are met simultaneously by using dynamic nonlinear functions. This removes the drawbacks of both high-order and low-order static nonlinear functions by, in effect, being low order (and therefore having low bandwidth expansion) for fast (i.e. wideband) signal variations, and being high order (and having high efficiency) for slow (i.e. narrowband) signal variations.

Figure 2A:
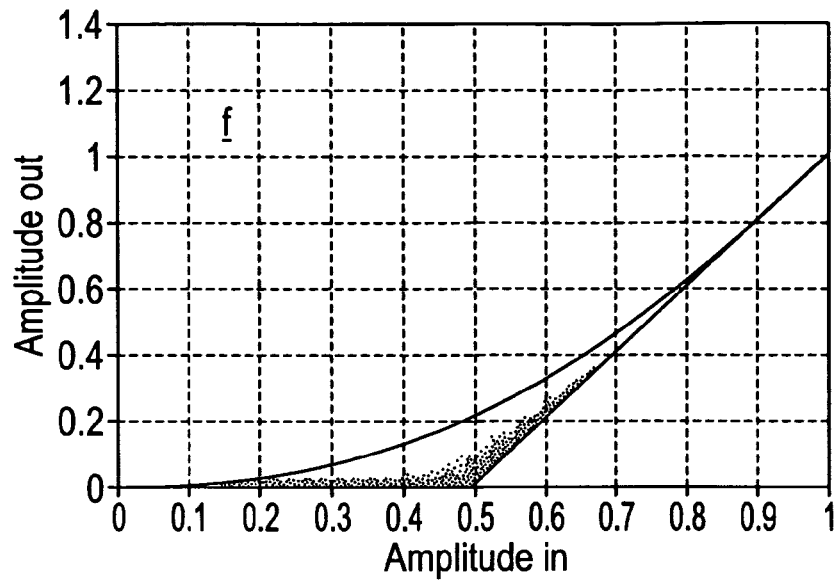
FIG. 2A shows an example embodiment of a non-linear dependency f of the envelope of the second radio frequency signal from an amplitude characteristic of the input signal.
Figure 2B:
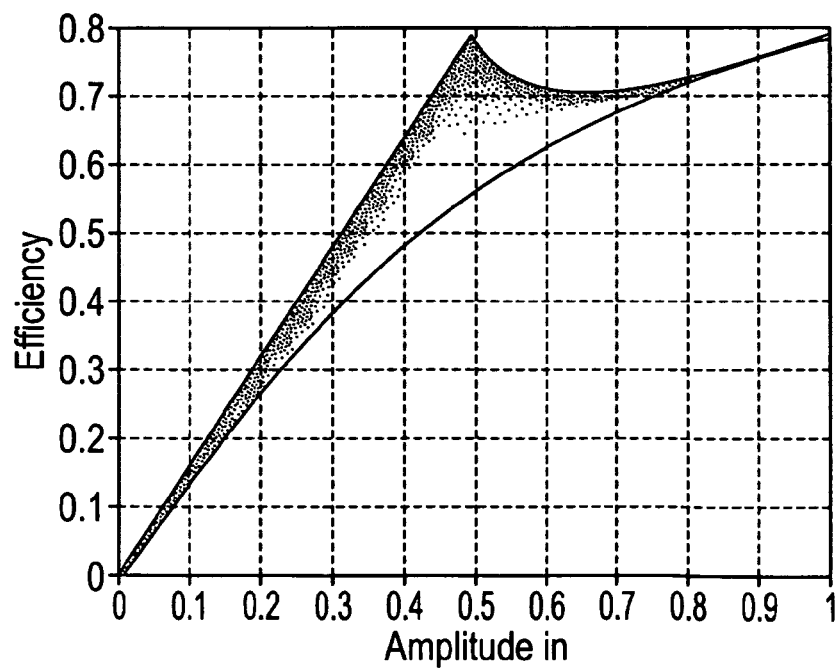
FIG. 2B shows an example diagram for illustrating dynamic power efficiencies of a radio frequency power amplifier.

As shown in FIG. 2A, a dynamic nonlinear function at an average (but not all the time) stays closer to the ideal, sharp-kneed, function, especially in the knee region. This behaviour gives a higher average efficiency of the amplifier. The corresponding efficiency curves are shown in FIG. 2B.

Figure 3:
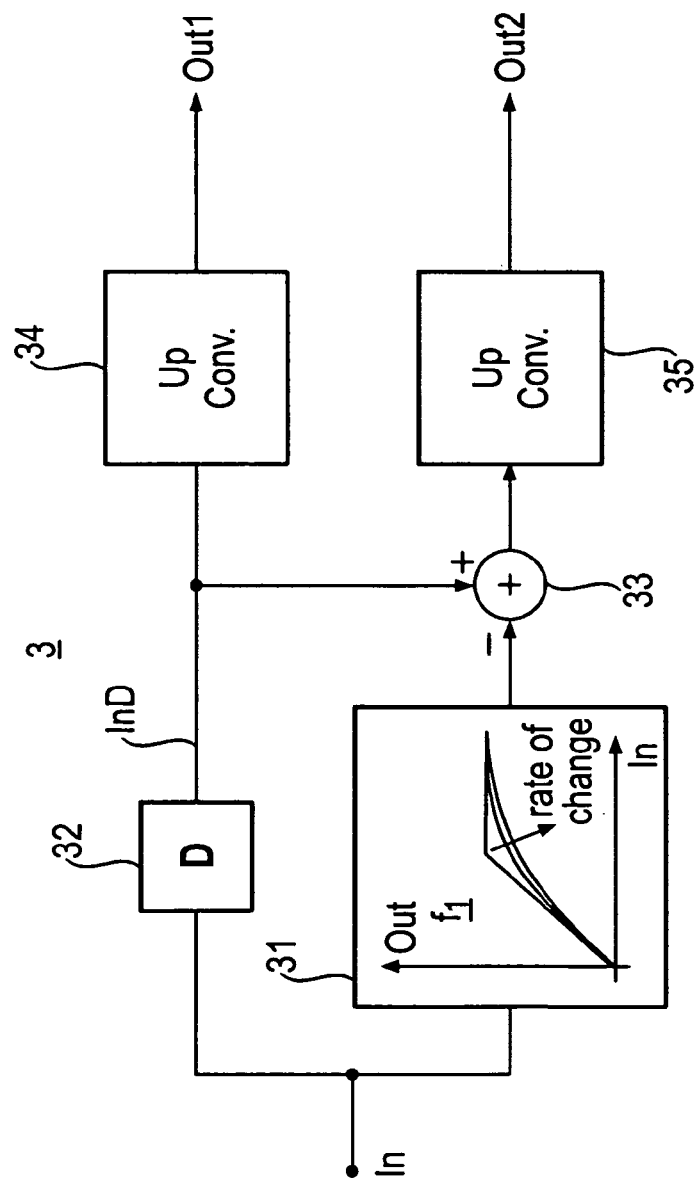
FIG. 3 shows an example block diagram of the signal processing section 3 shown in FIG. 1.

FIG. 3 shows an example block diagram of the signal processing section 3 shown in FIG. 1. In FIG. 3, 31 denotes a non-linear processing section that provides a dynamically non-linear dependency fl from an amplitude characteristic of the input signal In input into the RF power amplifier circuit 10 shown in FIG. 1. Which particular amplitude characteristic will be used, depends on whether the input signal In is an RF signal with varying signal envelope, or whether according to another embodiment the signal In is a base band representation of the signal envelope of the RF signal to be generated by the power amplifier circuit 10, or whether the input signal In is a digital representation of the signal envelope to be to be generated by the RF power amplifier 10 according to yet another embodiment. Of course, the present invention is not limited to any of these particular embodiments. 32 denotes a delay element to provide a delayed version InD of the amplitude characteristic of the input signal In to the RF power amplifier circuit as shown in FIG. 1. 33 denotes a subtractor for subtracting the dynamically non-linearly processed input signal from the delayed version of the input signal In. The delayed version of the input signal and the output of the subtractor 33 are further processed in Up-Converters 34 and 35, respectively, in order to provide the RF signals to be amplified by the main amplifier device and auxiliary amplifier device, resp.

Figure 4:
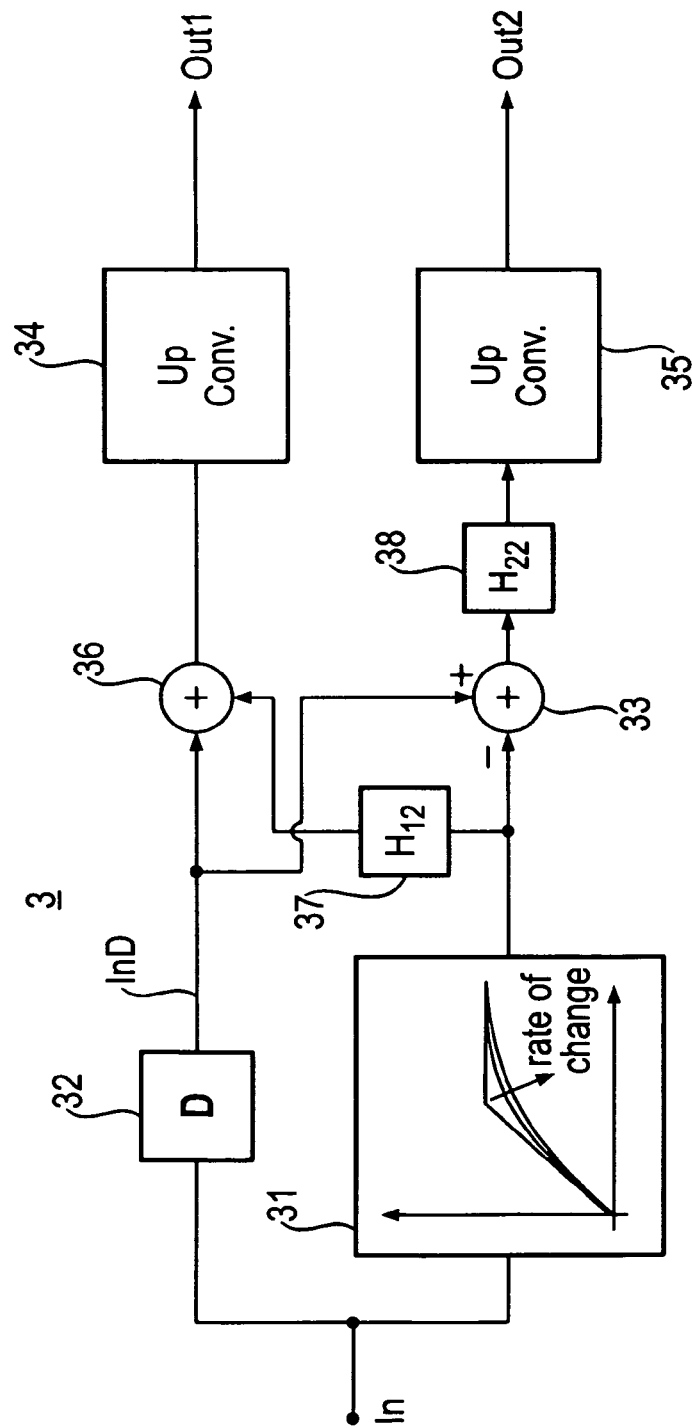
FIG. 4 shows another example block diagram of the signal processing section 3 shown in FIG. 1.

FIG. 4 shows another example block diagram of the signal processing section 3 shown in FIG. 1. In FIG. 4, the same reference numerals are used as in FIG. 3 to denote the same or corresponding parts, such that these parts need not be described again. 36 denotes an adder for adding a filtered version of the output from the dynamically non-linear processing section 31 to the delayed version InD of the amplitude characteristic of the input signal In. H12 and H22 denote filter circuits for cross coupling the branch signals in the main amplifier branch (Out1) and the auxiliary amplifier branch (Out2). In this example embodiment, also the main amplifier signal branch includes a portion of the dynamic non-linear function. The filters H12 and H22 are designed such that the dynamic non-linear function cancels at the output of the RF power amplifier 10.

Instead of being static functions of the input signal, the nonlinear signals of this invention are dynamic functions, which are by way of non-limiting example embodiments created by nonlinear filtering operations. In a preferred example embodiment shown in FIG. 5 and in another example embodiment shown in FIG. 6, the nonlinear filtering is carried out with respect to one or more boundaries. The boundaries can for example be constant amplitude limits or functions of the input signal amplitude or input signal level.

Figure 5:
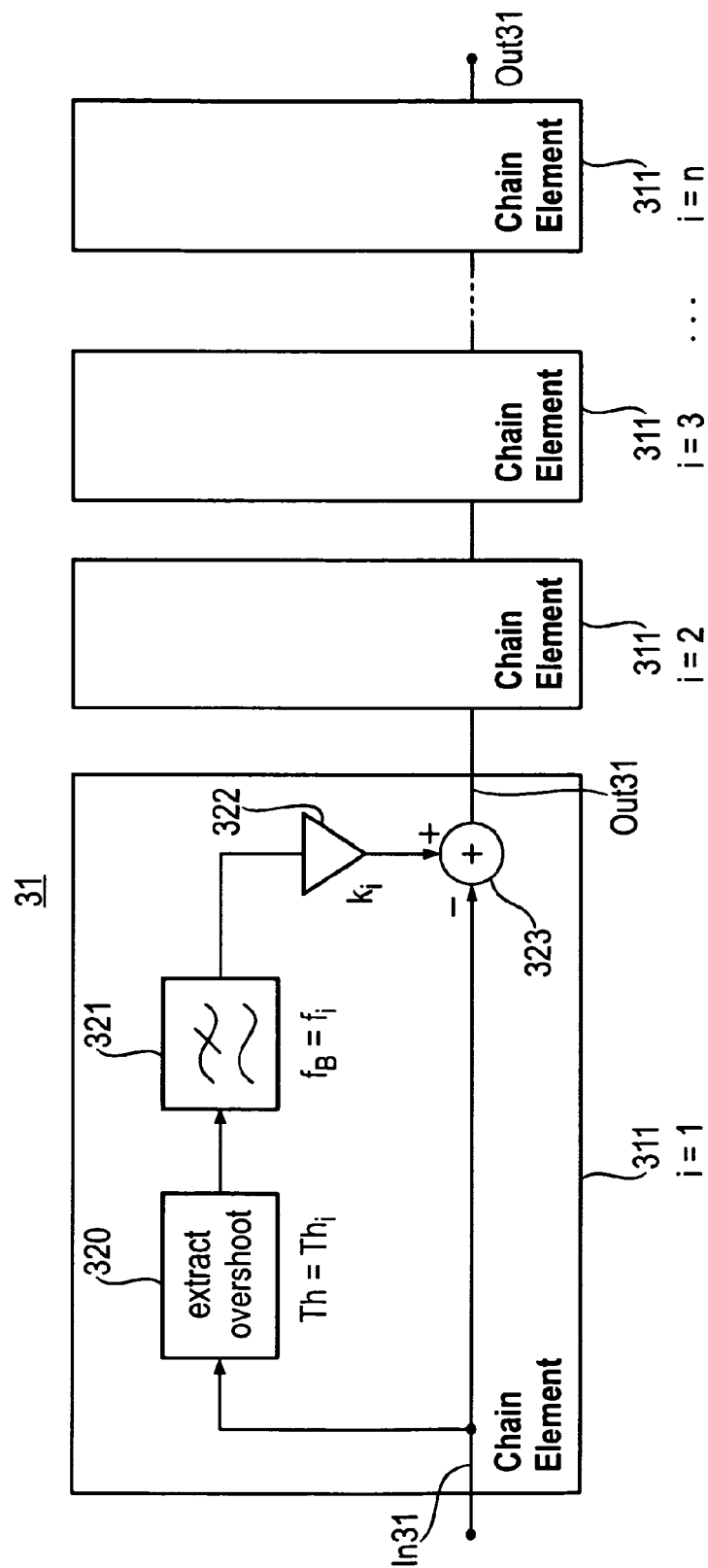
FIG. 5 shows an example block diagram of a dynamic non-linear processing section.

An exemplary embodiment of a dynamic non-linear processing section shown in FIG. 5 uses a cascade of stages 311*i*, i=1 . . . n, each extracting in section 320 overshooting parts (with respect to an amplitude boundary) of the output signal In 31, Out31 of the previous stage, the extracted overshoots being filtered in section 321 to the desired bandwidth (and placement) before reinsertion to the signal by means of an adder 323.

The bandwidth-restricted nonlinear signals can in many cases be created and successfully applied without detailed knowledge of the output network's frequency dependences. A more optimal design may include the output network's frequency dependence.

In each stage shown in FIG. 5, the overshooting (above a certain level or outside an amplitude-dependent boundary) part of the signal coming from a previous stage passes through a filter that restricts its bandwidth. The result is then subtracted from the signal from the previous stage. In this way, a band-limited and amplitude-shaped signal is built up stage-by-stage (from generally smaller and smaller contributions).

An additional filter at the input can be used to obtain a desired frequency response, for example one that gives maximum output power or maximal efficiency in the whole bandwidth, at the output node of the main amplifier. For Doherty amplifiers in which one can disregard the frequency dependence in the output network, the nonlinear signal can be shaped independently using a single amplitude function as boundary. This translates into a cylindrical boundary in the 3-dimensional (complex signal as two dimensions plus the signal's amplitude as the third) space. In the Doherty case, the amplitude limit is constant, usually set to half the maximum output level. The resulting signal can be subtracted from a scaled version of the original signal, or a scaled version of the original signal can be subtracted from it. These schemes result in two canonical nonlinear signal versions that can be applied in Doherty amplifiers. The signals that are input to the power transistors are made from combinations of scaled linear and nonlinear signals (made with the present method). The scaling can (suboptimally) be made frequency dependent, with generally different frequency dependencies for the different components and for the same component in the different combinations.

Figure 6:
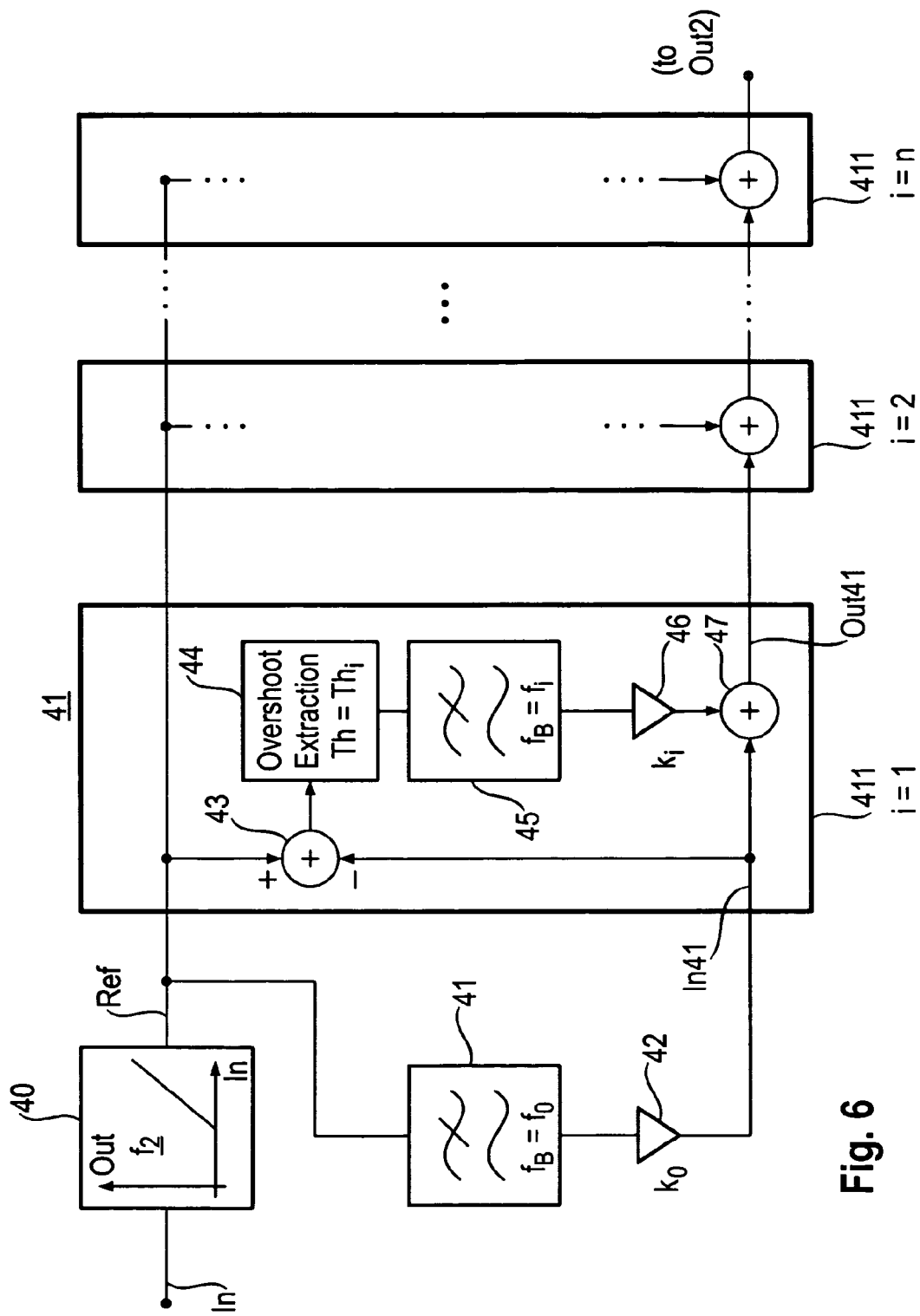
FIG. 6 shows another example block diagram of a dynamic non-linear processing section.

FIG. 6 shows another example block diagram of a dynamic non-linear processing section for dynamic non-linear signal shaping.

Here, the peak (auxiliary) amplifier drive signal is built up from zero by successively adding filtered, rectified differences between the signal under construction and the desired (without bandwidth restrictions) nonlinear signal.

In correctly tuned Doherty amplifiers in which one cannot disregard the frequency dependence in the output combiner network, it is more optimal to shape the nonlinear signals using information about the output network. This can be for example in the form of Z-parameters, describing the voltage responses at nodes in the output network in response to current excitations. In Doherty-like amplifiers only the "main" amplifier output node may need to be precisely emulated, since only the voltage at this node directly needs to be non-linearly shaped using a boundary function.

Signal shaping for a Doherty amplifier with frequency dependence in the output network can thus be achieved with the structure shown in FIG. 6, with the input signal optionally pre-filtered to achieve flat frequency response at the output node (by Z11/Zo1, Z being Z-parameters of the output network and subscript o referring to output node).

Another method for generating the dynamic nonlinear function of Doherty and similar amplifiers includes generating the optimal drive signals without bandwidth limitations. The overshooting parts (outside of boundaries) of bandwidth-limited versions of these signals are then extracted, recalculated into reinsertion signals, and filtered with the bandwidth-limiting filter in subsequent stages. By storing the derivatives of the efficiency with respect to the drive signals, the optimal direction for the reinsertion signal can be calculated. This works for moderate bandlimiting, since the filtered signals are close to the optimal ones. Yet another method is similar to the previous one, except that the optimal direction of reinsertion is assumed to be in the direction of the optimal drive signals without bandwidth limitations. This way, the derivatives do not have to be stored. The starting material is the drive signal that would give the highest efficiency without voltage limitations. Usually this means that a single transistor is driven.

Figure 7:
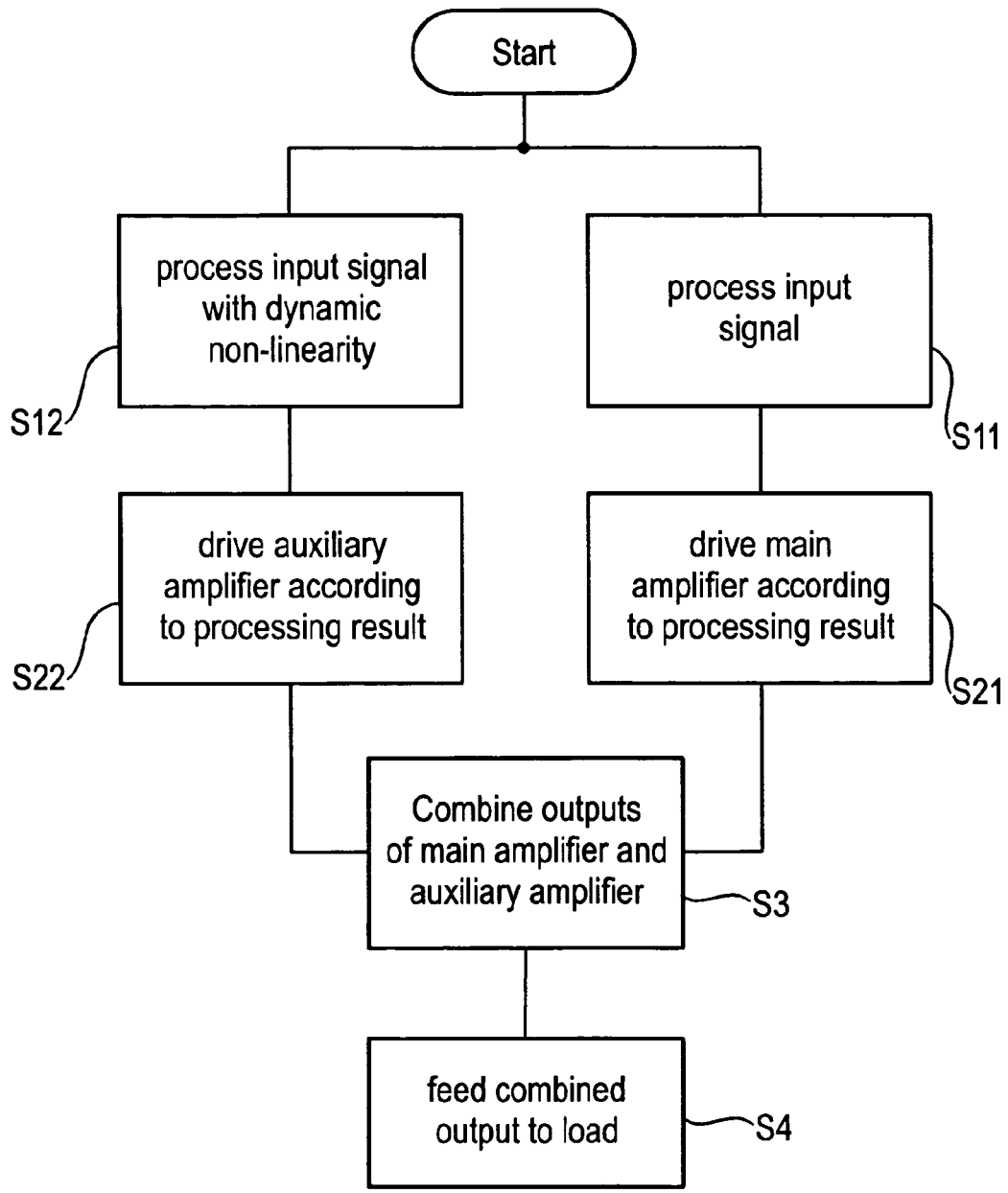
FIG. 7 shows an example flow chart for illustrating in exemplary fashion a method of providing a power amplified radio frequency signal.

FIG. 7 shows an embodiment of a method of providing a power amplified radio frequency signal having a variable signal amplitude. In this flow, the operations 512 and S22 relate to processing signals for the auxiliary amplifier branch 2 shown in FIG. 1. The operations S11 and S21 relate to processing signals for the main amplifier 1 branch shown in FIG. 1. In operation 511, the input signal In to the RF power amplifier 10 shown in FIG. 1 is processed to obtain the signal Out 1 for driving the main amplifier 1. In operation S12, the input signal In is processed with dynamic non-linearity to obtain the signal Out2 for driving the auxiliary amplifier 2. In the operations S21 and S22, resp., the main amplifier device and the auxiliary amplifier device are driven in accordance with the signals Out 1 and Out2, resp. In operation S3, the outputs of the main amplifier device and of the auxiliary amplifier device are combined together using the combiner network 4 shown in FIG. 1 in order to feed the combined output to a load ZL, as shown in 54.

ADVANTAGES OF THE INVENTION

The invention allows operation with high efficiency, under restricted bandwidth conditions. The bandwidth expansion may be considerably reduced. Consequently, the invention also allows operation with increased signal bandwidth while retaining an acceptable efficiency.

The embodiments described above are to be understood as a few illustrative examples of the present invention. It will be understood by those skilled in the art that various modifications, combinations and changes may be made to the embodiments without departing from the scope of the present invention which is defined by the appended claims.

The invention claimed is:

1. An amplifier circuit for providing a radio frequency output signal having a variable signal envelope, comprising:
    a main amplifier device having an input and an output for outputting a first radio frequency output signal;
    an auxiliary amplifier device having an input and an output for outputting a second radio frequency output signal;
    a combiner network for combining at least a component of said first radio frequency output signal from said main amplifier device and at least a component of said second radio frequency output signal from said auxiliary amplifier device to provide a combined output signal of variable signal envelope to a load; and
    a signal processing circuit comprising:
        an input for receiving an input signal;
        a first output coupled to the input of the main amplifier device for providing a first radio frequency signal to be amplified by said main amplifier device; and
        a second output coupled to the input of the auxiliary amplifier device for providing a second radio frequency signal to be amplified by said auxiliary amplifier device;
    wherein said signal processing circuit comprises a non-linear processing section coupled to the input of the signal processing circuit and adapted to provide at least said second radio frequency signal with a signal envelope that has a non-linear dependency from an amplitude characteristic of the input signal;
    wherein:
        the non-linear processing section is adapted such that a degree of non-linearity of the non-linear dependency varies dependent on an amount of change per time unit of the amplitude characteristic of the input signal.

2. The amplifier circuit according to claim 1, wherein the signal processing circuit comprises:

a signal subtraction section arranged to subtract an output signal of the non-linear processing section from a signal obtained from the input signal to provide a resulting signal; and a section for generating from the resulting signal the second radio frequency signal to be amplified by the auxiliary amplifier device.

3. The amplifier circuit according to claim 2, wherein the signal processing circuit comprises:

a first filter circuit coupled between an output of the signal subtraction section and the section for generating the second radio frequency signal.

4. The amplifier circuit according to claim 2, comprising:

a signal addition section arranged to add a signal obtained from the non-linear processing section to the signal obtained from the input signal; and a section for generating from an output signal of the signal addition section the first radio frequency signal to be amplified by the main amplifier device.

5. The amplifier circuit according to claim 4, comprising:

a second filter circuit coupled to filter an output of the non-linear processing section;

wherein the output of the second filter circuit is coupled to the signal addition section.

6. The amplifier circuit according to claim 2, wherein the signal processing circuit comprises a delay element coupled between the input of the signal processing circuit and the signal subtraction section.

7. The amplifier circuit according to claim 1, wherein the signal processing circuit is adapted:

to receive at its input an amplitude modulated input signal; and wherein said amplitude characteristic of the input signal is the envelope of the amplitude modulated input signal.

8. The amplifier circuit according to claim 1, wherein the signal processing circuit is adapted:

to receive at its input a base band input signal; and said amplitude characteristic of the input signal is an instantaneous amplitude of the input signal.

9. The amplifier circuit according to claim 8, wherein said signal processing circuit comprises a digital signal processor and is adapted to receive and process said input signal in a time and amplitude discrete representation.

10. The amplifier circuit according to claim 1, wherein the signal processing circuit comprises a first converter circuit for generating said first radio frequency signal and a second converter circuit for generating said second radio frequency signal in accordance with envelope signals obtained by processing of said input signal.

11. The amplifier circuit according to claim 1, wherein said non-linear processing section comprises a chain comprising at least one non-linear element, each non-linear element having an input and an output; each non-linear element comprising:

an overshoot extractor section for extracting a component of a signal at the input of the non-linear element that exceeds a level predefined for the respective non-linear element;

a low pass filter circuit having a bandwidth predefined for the respective non-linear element and coupled to low pass filter the component extracted by the overshoot extractor section; and a subtractor section for subtracting from the signal at the input of the non-linear element an output signal of the low pass filter circuit multiplied by a gain factor predefined for the respective non-linear element, an output of the subtractor section being coupled to the output of the non-linear element.

12. The amplifier circuit according to claim 1, wherein said non-linear processing section comprises:

a reference signal generating section for providing a wideband reference signal obtained by applying a non-linear function on said input signal;

a chain comprising at least one non-linear element coupled to build up a control signal having a bandwidth less than a bandwidth of said reference signal by successively adding filtered rectified differences between a signal obtained from a preceding chain element and the reference signal; and a signal output of a last non-linear element in the chain being coupled to be used in controlling an envelope amplitude of the second radio frequency signal.

13. The amplifier circuit according to claim 1, wherein said combiner network comprises an impedance inverting network and/or a quarter wavelength transmission line.

14. The amplifier circuit according to claim 1, the amplifier circuit being of the Doherty amplifier type.

15. A mobile communication device comprising:

an amplifier circuit for providing a radio frequency output signal having a variable signal envelope, comprising:

a main amplifier device having an input and an output for outputting a first radio frequency output signal;

an auxiliary amplifier device having an input and an output for outputting a second radio frequency output signal;

a combiner network for combining at least a component of said first radio frequency output signal from said main amplifier device and at least a component of said second radio frequency output signal from said auxiliary amplifier device to provide a combined output signal of variable signal envelope to a load; and a signal processing circuit comprising:

an input for receiving an input signal;

a first output coupled to the input of the main amplifier device for providing a first radio frequency signal to be amplified by said main amplifier device; and a second output coupled to the input of the auxiliary amplifier device for providing a second radio frequency signal to be amplified by said auxiliary amplifier device;

wherein said signal processing circuit comprises a non-linear processing section coupled to the input of the signal processing circuit and adapted to provide at least said second radio frequency signal with a signal envelope that has a non-linear dependency from an amplitude characteristic of the input signal;

wherein:

the non-linear processing section is adapted such that a degree of non-linearity of the non-linear dependency varies dependent on an amount of change per time unit of the amplitude characteristic of the input signal.

16. A base station for a mobile communication network, the base station comprising:

an amplifier circuit for providing a radio frequency output signal having a variable signal envelope, comprising:

a main amplifier device having an input and an output for outputting a first radio frequency output signal;

an auxiliary amplifier device having an input and an output for outputting a second radio frequency output signal;

a combiner network for combining at least a component of said first radio frequency output signal from said main amplifier device and at least a component of said second radio frequency output signal from said auxiliary amplifier device to provide a combined output signal of variable signal envelope to a load; and a signal processing circuit comprising:
  an input for receiving an input signal;
    a first output coupled to the input of the main amplifier device for providing a first radio frequency signal to be amplified by said main amplifier device; and
    a second output coupled to the input of the auxiliary amplifier device for providing a second radio frequency signal to be amplified by said auxiliary amplifier device:
  wherein said signal processing circuit comprises a non-linear processing section coupled to the input of the signal processing circuit and adapted to provide at least said second radio frequency signal with a signal envelope that has a non-linear dependency from an amplitude characteristic of the input signal;
  wherein:
    the non-linear processing section is adapted such that a degree of non-linearity of the non-linear dependency varies dependent on an amount of change per time unit of the amplitude characteristic of the input signal.

17. A method of power amplifying a radio frequency signal having a variable signal envelope, comprising:
  providing a first radio frequency output signal by a main amplifier device;
  providing a second radio frequency output signal by an auxiliary amplifier device;
  combining at least a component of said first radio frequency output signal from said main amplifier device and at least a component of said second radio frequency output signal from said auxiliary amplifier device in a combiner network to provide a combined output signal of variable signal envelope to a load;
  signal processing an input signal in a signal processing circuit to provide:
    a first output signal to an input of the main amplifier device for providing a first radio frequency signal to be amplified by said main amplifier device; and
    a second output signal to an input of the auxiliary amplifier device for providing a second radio frequency signal to be amplified by said auxiliary amplifier device; and
  said signal processing comprising non-linear processing of said input signal to provide a non-linear dependency of an envelope of at least said second radio frequency signal from an amplitude characteristic of the input signal;
  wherein:
    a degree of non-linearity of the non-linear dependency varies dependent on an amount of change per time unit of the amplitude characteristic of the input signal.

* * * * *

UNITED STATES PATENT AND TRADEMARK OFFICE
CERTIFICATE OF CORRECTION

PATENT NO.        : 8,917,141 B2
APPLICATION NO.   : 13/505777
DATED             : December 23, 2014
INVENTOR(S)       : Hellberg et al.

Page 1 of 1

It is certified that error appears in the above-identified patent and that said Letters Patent is hereby corrected as shown below:

In the Specification

In Column 1, Line 33, delete "RE" and insert -- RF --, therefor.

In Column 3, Line 46, delete "RE" and insert -- RF --, therefor.

In Column 5, Line 52, delete "function" and insert -- function. --, therefor.

In Column 8, Line 3, delete "512" and insert -- S12 --, therefor.

In Column 8, Line 7, delete "511," and insert -- S11, --, therefor.

In Column 8, Line 18, delete "54." and insert -- S4. --, therefor.

In the Claims

In Column 11, Line 11, in Claim 16, delete "device:" and insert -- device; --, therefor.

Signed and Sealed this
Seventh Day of July, 2015

Michelle K. Lee
*Director of the United States Patent and Trademark Office*